(12) United States Patent
Yayama et al.

(10) Patent No.: US 9,281,780 B2
(45) Date of Patent: *Mar. 8, 2016

(54) RESISTANCE CORRECTION CIRCUIT, RESISTANCE CORRECTION METHOD, AND SEMICONDUCTOR DEVICE

(71) Applicant: RENESAS ELECTRONICS CORPORATION, Kanwasaki-shi, Kanagawa (JP)

(72) Inventors: Kosuke Yayama, Kanagawa (JP); Takashi Nakamura, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/560,013

(22) Filed: Dec. 4, 2014

(65) Prior Publication Data

US 2015/0162874 A1  Jun. 11, 2015

Related U.S. Application Data

(63) Continuation of application No. 14/066,731, filed on Oct. 30, 2013, now Pat. No. 8,970,266.

(30) Foreign Application Priority Data

Oct. 31, 2012 (JP) .................. 2012-240532

(51) Int. Cl.
*H01C 13/02* (2006.01)
*H03B 5/24* (2006.01)
*H01L 27/08* (2006.01)
*H01L 49/02* (2006.01)

(52) U.S. Cl.
CPC .................. *H03B 5/24* (2013.01); *H01C 13/02* (2013.01); *H01L 27/0802* (2013.01); *H01L 28/20* (2013.01)

(58) Field of Classification Search
CPC .......... H01C 17/22; H01C 13/02; H03B 5/24; H01L 27/0802; H01L 28/20
See application file for complete search history.

(56) References Cited

U.S. PATENT DOCUMENTS

| 6,064,224 A | 5/2000 | Esch et al. |
| 6,100,766 A | 8/2000 | Segawa et al. |
| 2006/0290387 A1 | 12/2006 | Gossmann et al. |

FOREIGN PATENT DOCUMENTS

JP  10-322196 A  12/1998

OTHER PUBLICATIONS

"Operating Principles and Glossary of Fujikura Semiconductor Pressure Sensors," Oct. 31, 2012, (http://www.fujikura.co.jp/products/electronic/sensor/data/technical_note.pdf#search='Fujikura %20 semiconductor pressure sensor 9').
"Mechanical stress of the electrical performance of polycrystalline-silicon resistors," Journal of Materials Research, vol. 16 (2001), pp. 2579-2582, ("Studies on the influence of external environment on polycrystalline-silicon thin-film resistors," Masakazu Nakabayashi, Kumamoto University Repository System).

*Primary Examiner* — Jung Kim
(74) *Attorney, Agent, or Firm* — Shapiro, Gabor and Rosenberger, PLLC

(57) ABSTRACT

Disclosed is a semiconductor device that suppresses stress-induced resistance value changes. The semiconductor device includes a resistance correction circuit. The resistance correction circuit includes a first resistor whose stress-resistance value relationship is a first relationship, a second resistor whose stress-resistance value relationship is a second relationship, and a correction section that controls the resistance value of a correction target resistor. The correction section detects the difference between the resistance value of the first resistor and the resistance value of the second resistor and corrects, in accordance with the result of detection, the resistance value of the correction target resistor.

10 Claims, 9 Drawing Sheets

RESISTANCE CORRECTION CIRCUIT, RESISTANCE CORRECTION METHOD, AND SEMICONDUCTOR DEVICE

CROSS-REFERENCE TO RELATED APPLICATIONS

The disclosure of Japanese Patent Application No. 2012-240532 filed on Oct. 31, 2012 including the specification, drawings, and abstract is incorporated herein by reference in its entirety.

BACKGROUND

The present invention relates to a resistance correction circuit, a resistance correction method, and a semiconductor device.

Semiconductor devices include a semiconductor chip. In some cases, the semiconductor chip may include a resistor. To obtain desired semiconductor device characteristics, it is important that the resistor have a desired resistance value.

For example, the semiconductor chip may include an on-chip oscillator (OCO). The OCO is an oscillator circuit integrated on the semiconductor chip and used to generate a clock signal. The OCO includes a resistor that determines an oscillation frequency. If the resistor does not have a desired resistance value, a desired oscillation frequency cannot be obtained.

In some cases, the resistance of the resistor may depend on stress. In this context, the document named "Operating Principles and Glossary of Fujikura Semiconductor Pressure Sensors," Oct. 31, 2012 (http://www.fujikura.co.jp/products/electronic/sensor/data/technical_note.pdf#search='Fujikura%20semiconductor pressure sensor9') discloses that a piezoresistive effect causes a change in resistivity in accordance with stress applied to a resistor. Further, the document named "Mechanical stress of the electrical performance of polycrystalline-silicon resistors," Journal of Materials Research, Vol. 16 (2001), pp. 2579-2582 ("Studies on the influence of external environment on polycrystalline-silicon thin-film resistors," Masakazu Nakabayashi, Kumamoto University Repository System) discloses that the resistance value of polycrystalline silicon thin film is dependent on stress.

Furthermore, in association with an oscillator circuit, a correction circuit is disclosed in Japanese Unexamined Patent Publication No. Hei 10 (1998)-322196. This correction circuit includes an oscillator circuit and a logic circuit. The logic circuit measures the oscillation frequency of the oscillator circuit and generates a predefined control signal for acquiring a constant oscillation frequency. In accordance with the control signal, the correction circuit controls the characteristic values of the oscillator circuit and of a correction target circuit by changing the respective element values of their elements.

SUMMARY

In the manufacture of a semiconductor device, a semiconductor chip is sealed with mold resin in a package assembly process. When the semiconductor chip is sealed, heat is applied to the mold resin so that the mold resin thermally shrinks. When the mold resin thermally shrinks, the semiconductor chip is subjected to compressive stress. As a result, the stress applied to resistance may change, thereby changing the resistance value of a resistor included in the semiconductor chip. The manufacture of the semiconductor device also includes a reflow process and other processes. In these processes, too, the stress applied to the semiconductor chip may change, thereby changing the resistance value of the resistor. If the resistor is formed of a polysilicon layer, its resistance value changes due to a stress-induced piezoresistive effect. If, on the other hand, the resistor is formed of titanium nitride or other metal element, a change in the stress changes the shape of the resistor, thereby changing its resistance value.

It is conceivable that resistance value changes caused by stress changes may be suppressed by disposing the resistor at a place where stress changes are small. However, this method imposes significant restrictions from the viewpoint, for instance, of layout and resistor orientation.

The document named "Operating Principles and Glossary of Fujikura Semiconductor Pressure Sensors," Oct. 31, 2012 (http://www.fujikura.co.jp/products/electronic/sensor/data/technical_note.pdf#search='Fujikura%20semiconductor pressure sensor9') and the document named "Mechanical stress of the electrical performance of polycrystalline-silicon resistors," Journal of Materials Research, Vol. 16 (2001), pp. 2579-2582 ("Studies on the influence of external environment on polycrystalline-silicon thin-film resistors," Masakazu Nakabayashi, Kumamoto University Repository System) do not disclose a method of suppressing resistance value changes caused by stress changes although they both disclose a fact that the resistance value changes due to stress. Further, Japanese Unexamined Patent Publication No. Hei 10 (1998)-322196 did not describe the resistance value changes caused by stress changes.

Other problems and novel features will become apparent from the following description and from the accompanying drawings.

According to an aspect of the present invention, there is provided a resistance correction circuit including a first resistor, a second resistor, and a control circuit. The stress-resistance value relationship of the first resistor is a first relationship. The stress-resistance value relationship of the second resistor is a second relationship. The control circuit controls the resistance value of a correction target resistor. The control circuit includes a detection circuit and a correction circuit. The detection circuit detects the difference between the resistance value r1 of the first resistor and the resistance value r2 of the second resistor. The correction circuit corrects the resistance value of the correction target resistor in accordance with the result of detection by the detection circuit.

The above aspect of the present invention makes it possible to correct resistance value changes caused by stress changes.

DETAILED DESCRIPTION

Embodiments of the present invention will now be described with reference to the accompanying drawings.

First Embodiment

Figure 1:
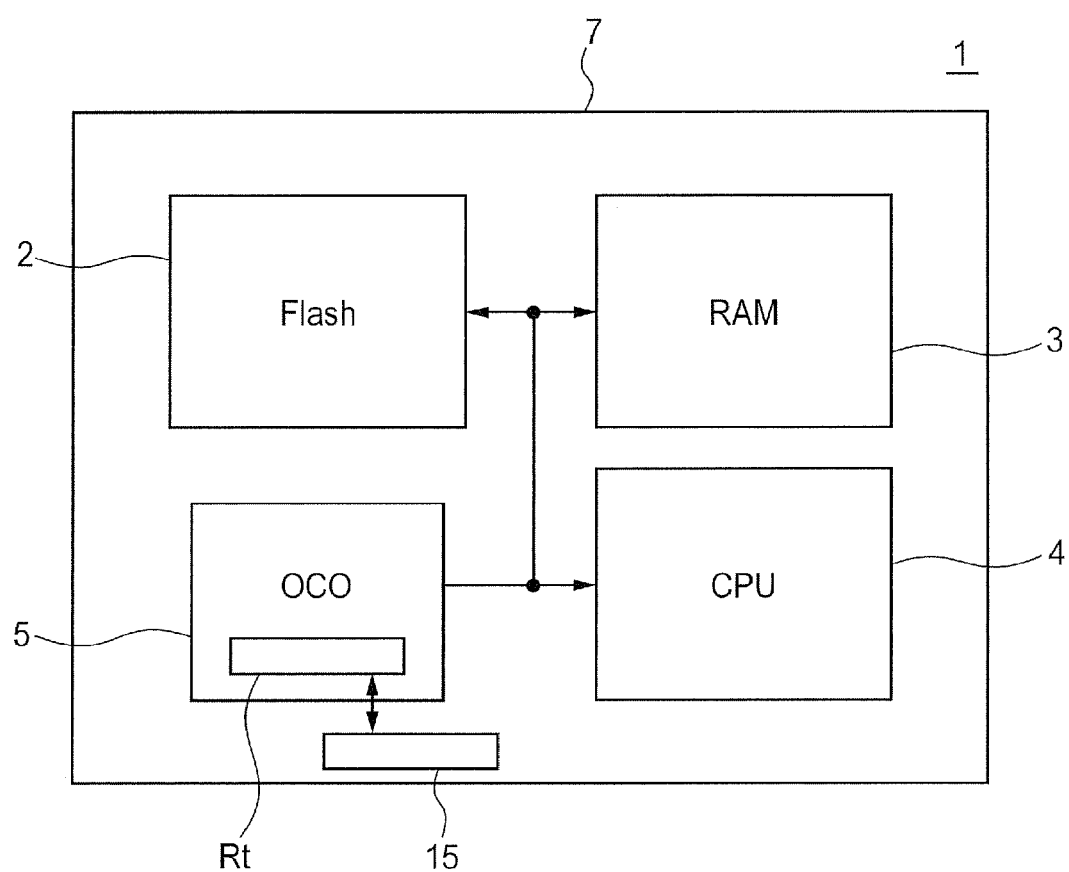
FIG. 1 is a schematic diagram illustrating a semiconductor device according to a first embodiment.

FIG. 1 is a schematic diagram illustrating a semiconductor device 1 according to a first embodiment.

As shown in FIG. 1, the semiconductor device 1 includes a semiconductor chip 7. The semiconductor chip 7 includes a CPU 4, a flash memory 2, a RAM 3, and an OCO 5. The OCO 5 generates a clock signal and supplies the generated clock signal to the CPU 4, to the RAM 3, and to the flash memory 2. The CPU 4, the RAM 3, and the flash memory 2 operate in accordance with the clock signal. Although not shown, the semiconductor chip 7 is sealed with mold resin.

As the OCO 5 (oscillator circuit) is mounted on the semiconductor chip 7, no clock source (crystal oscillator, ceramic oscillator, etc.) needs to be disposed external to the semiconductor device 1. This makes it possible to considerably reduce the area of a printed circuit board on which the semiconductor device 1 is mounted. Further, as no external clock source needs to be mounted, a clock source mounting failure does not occur. This enhances the durability of a system that uses the semiconductor device 1.

Meanwhile, the output frequency of the OCO 5 is determined by the resistance value of a resistor included in the OCO 5. As described earlier, the resistance value of a resistor varies due to stress changes during an assembly process or the like. When the resistance value varies, the output frequency of the OCO 5 varies. This degrades the frequency accuracy of the clock signal. In the present embodiment, therefore, the semiconductor chip 7 includes a resistance correction circuit 15. The resistance correction circuit 15 is capable of correcting the resistance value of a correction target resistor Rt included in the OCO 5.

Figure 2:
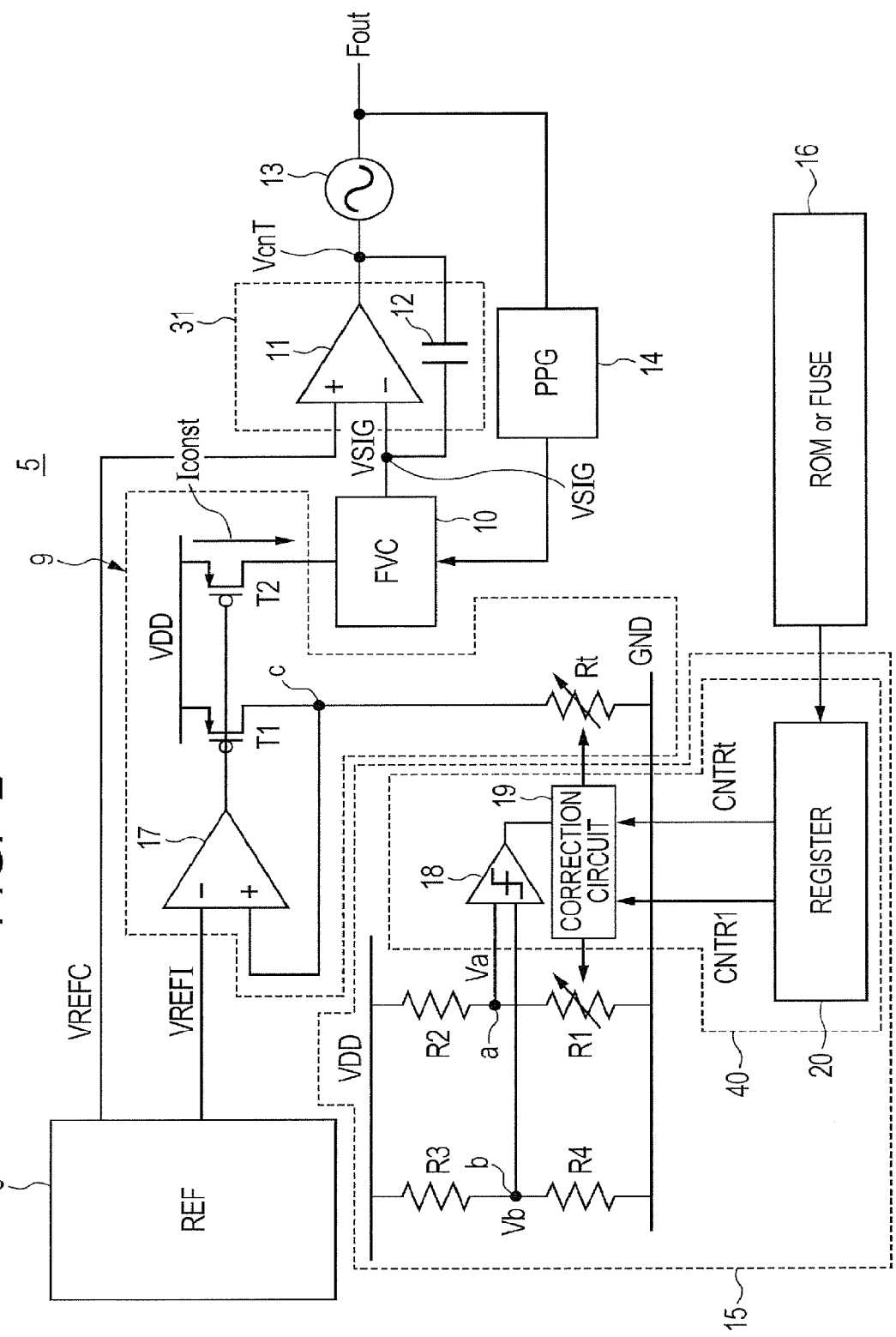
FIG. 2 is a circuit diagram illustrating an OCO and a resistance correction circuit.

The configurations of the OCO 5 and resistance correction circuit 15 will now be described in detail. FIG. 2 is a circuit diagram illustrating the OCO 5 and the resistance correction circuit 15.

First of all, the OCO 5 will be described.

The OCO 5 includes a reference voltage generator circuit 8, a current output circuit 9, a frequency-to-voltage converter circuit 10 (FVC), an integration circuit 31, a voltage-controlled oscillator circuit 13, and a control circuit 14. The reference voltage generator circuit 8 generates a reference voltage VREFI and a reference voltage VREFC. The reference voltage VREFI is used to inhibit an oscillation frequency from being varied by temperature. The current output circuit 9 converts the reference voltage VREFI to a reference current Iconst and supplies the reference current Iconst to the frequency-to-voltage converter circuit 10 (FVC). The frequency-to-voltage converter circuit 10 includes a capacitor (not shown). The frequency-to-voltage converter circuit 10 uses the reference current Iconst to charge the capacitor. A voltage VSIG of the capacitor is supplied to the integration circuit 31. The integration circuit 31 includes an operational amplifier 11 and a capacitor 12. The positive (+) input end of the operational amplifier 11 is coupled to the reference voltage generator circuit 8 so that the reference voltage VREFC is applied to the positive (+) input end of the operational amplifier 11. The negative (−) input end of the operational amplifier 11 is coupled to the frequency-to-voltage converter circuit 10 so that the voltage VSIG is applied to the negative (−) input end of the operational amplifier 11. The capacitor 12 is coupled at one end to the output end of the operational amplifier 11 and at the other end to the frequency-to-voltage converter circuit 10. The integration circuit 31 generates a control voltage VCNT in accordance with the voltage VSIG and with the reference voltage VREFC. The voltage-controlled oscillator circuit 13 generates an output signal Fout in accordance with the control voltage VCNT. The output signal Fout is supplied, for instance, to the CPU as a clock signal as described earlier. In accordance with the output signal Fout, the control circuit 14 generates a control signal for controlling the frequency-to-voltage converter circuit 10 and supplies the generated control signal to the frequency-to-voltage converter circuit 10.

The current output circuit 9 includes an operational amplifier 17, a transistor T1, a transistor T2, and a variable resistor Rt (correction target resistor Rt). The transistor T1 is disposed to switch the electrical coupling between a power supply VDD (first power supply) and a node c. The transistor T2 is disposed to switch the electrical coupling between the power supply VDD and the frequency-to-voltage converter circuit 10. The correction target resistor Rt is disposed to switch the electrical coupling between the node c and a second power supply (GND) and the frequency-to-voltage converter circuit 10. The negative (−) input end of the operational amplifier 17 is coupled to the reference voltage generator circuit 8 so that the reference voltage VREFI is supplied to the negative (−) input end of the operational amplifier 17. The positive (+) input end of the operational amplifier 17 is coupled to the node c. The output end of the operational amplifier 17 is coupled to the gate of the transistor T1 and to the gate of the transistor T2.

A current flowing in the current output circuit 9 through the transistor T2 is supplied to the frequency-to-voltage converter circuit 10 as the reference current Iconst. The magnitude of the reference current Iconst varies with the resistance value of the correction target resistor Rt. The magnitude of the reference current Iconst affects the voltage VSIG of the frequency-to-voltage converter circuit 10, the control voltage VCNT of the integration circuit 31, and the output signal Fout of the voltage-controlled oscillator circuit 13. In other words, the resistance value of the correction target resistor Rt affects the frequency of the clock signal. Specifically, the oscillation frequency F of the output signal Fout is expressed by equation (1) below:

$$F = VREFI/(VREFC \times Rt \times C) \tag{1}$$

where C is a capacitance value included in the frequency-to-voltage converter circuit 10, and Rt is the resistance value of the correction target resistor Rt. From equation (1), it is understood that the oscillation frequency F is in inverse proportion to the resistance value of the correction target resistor Rt. More specifically, when the resistance value of the correction target resistor Rt varies, the accuracy of the output frequency decreases.

Next, the resistance correction circuit 15 will be described.

As described earlier, the resistance correction circuit 15 is capable of correcting the resistance value of the correction target resistor Rt. As shown in FIG. 2, the resistance correction circuit 15 includes a correction section 40, a first resistor R1, a second resistor R2, a third resistor R3, and a fourth resistor R4.

The first resistor R1 is a variable resistor. The first resistor R1 is disposed between the second power supply GND and a node a (first node). The second resistor R2 is disposed between the first power supply VDD and the node a. The third resistor R3 is disposed between the first power supply VDD and a node b (second node). The fourth resistor R4 is disposed between the node b and the second power supply GND.

Figure 3A:
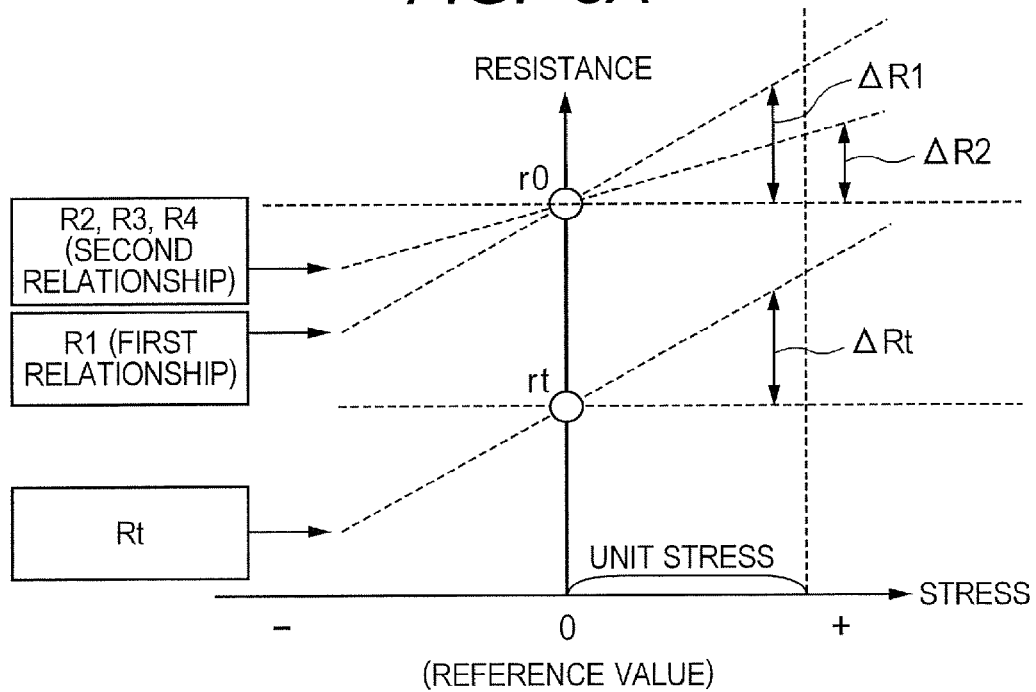
FIG. 3A is a diagram illustrating the relationship between stress and the resistance value of each resistor.

The relationship between stress and the resistance value of each resistor (R1-R4, Rt) will now be described. FIG. 3A is a diagram illustrating the relationship between stress and the resistance value of each resistor. As shown in FIG. 3A, it is assumed in the present embodiment that the resistance value of each resistor is proportional to the magnitude of stress. The relationship between the resistance value of the first resistor R1 and stress is defined as the first relationship. The relationship between the resistance value of the second resistor R2 and stress is defined as the second relationship. The first relationship is different from the second relationship. The third resistor R3 and the fourth resistor R4 have the same structure and shape as the second resistor R2 and exhibit the same resistance value as the second resistor R2.

The first resistor R1 and the second resistor R2 are set so that they exhibit the same resistance value when the magnitude of applied stress is equal to a reference value (0). The reference value represents the stress at which the resistance value of the correction target resistor Rt is equal to a target value rt. The target value rt represents the resistance value of the correction target resistor Rt that is exhibited when the frequency of the output signal Fout is equal to a target frequency. Specifically, trimming is performed after the manufacture of the semiconductor chip 7 and before the assembly process. In the process of trimming, the resistance value of the correction target resistor Rt is adjusted so that the frequency of the output signal Fout is equal to the target frequency. In the process of trimming, further adjustments are made so that the resistance value of the first resistor R1 is equal to the resistance values of the second to fourth resistors (R2, R3, R4).

As shown in FIG. 3A, the variability of the resistance value of the first resistor R1 with respect to the stress is ΔR1. The variability is the ratio of a resistance value variation amount per unit stress to a resistance value in a reference state. If, for example, the variability ΔR1 is 2% and the first resistor R1 is subjected to a stress different by a unit stress from the reference value, the resistance value of the first resistor R1 varies from the reference value r0 by 2% of the reference value r0.

Here, the variability ΔR1 is equal to the variability ΔRt of the resistance value of the correction target resistor Rt with respect to the stress. On the other hand, the variability ΔR2 of the resistance value of the second resistor R2 with respect to the stress is different from the variability ΔR1.

The relationship between the resistance value and the stress varies, for instance, with the shape and material of a resistor. Therefore, if the first resistor R1 and the second resistor R2 differ, for instance, in shape and material, it is possible to obtain the variability ΔR1 that is different from the variability ΔR2.

Next, the correction section 40 (see FIG. 2) will be described. The correction section 40 is capable of detecting the resistance value difference between the first resistor R1 and the second resistor R2 and correcting the resistance value of the correction target resistor Rt in accordance with the result of detection to attain the target value rt. As shown in FIG. 3A, the resistance value of each resistor is proportional to the stress. Therefore, determining the resistance value difference between the first resistor R1 and the second resistor R2 makes it possible to determine the variation of the resistance value of the first resistor R1 from the value r0 in the reference state. Further, as the variability ΔR1 is equal to the variability ΔRt, it is also possible to determine the variation of the resistance value of the correction target resistor Rt from the target value rt. Hence, the resistance value of the correction target resistor Rt can be corrected to attain the target value rt.

The configuration of the correction section 40 will now be described in detail. As shown in FIG. 2, the correction section 40 includes a comparator circuit 18, a correction circuit 19, and a register 20.

The comparator circuit 18 is configured to compare the resistance value of the first resistor R1 and the resistance value of the second resistor R2. The comparator circuit 18 compares the resistance value of the first resistor R1 and the resistance value of the second resistor R2 by comparing the potential Va of the node a with the potential Vb of the node b. The result of comparison is delivered to the correction circuit 19.

The correction circuit 19 is capable of correcting the resistance value of the first resistor R1 in accordance with the result of comparison by the comparator circuit 18 until it agrees with the resistance value of the second resistor R2. Further, when correcting the resistance value of the first resistor R1, the correction circuit 19 also corrects the resistance value of the correction target resistor Rt. The correction circuit 19 corrects the resistance value of the correction target resistor Rt by an amount corresponding to a correction amount X1 for the resistance value of the first resistor R1.

More specifically, the correction circuit 19 corrects the resistance value of the first resistor R1 as described below. When the potential of the first power supply VDD is Vr and the potential of the second power supply GND is 0, the potential Vb of the node b is Vr/2. Meanwhile, the potential Va of the node a is expressed by equation (2) below:

$$Va = R1/(R2+R1) \times Vr = R1/(R2+R1) \times 2Vb \qquad (2)$$

To ensure that Va=Vb, it is necessary that R1=R2. With this, the correction circuit 19 increases the resistance value of the first resistor R1 when Va>Vb and decreases the resistance value of the first resistor R1 when Va<Vb.

More specifically, the correction circuit 19 repeats a correction cycle until the resistance value of the first resistor R1 equals the resistance value of the second resistor R2 (until the potential of the node a is equal to the potential of the node b). During each execution of the correction cycle, the correction circuit 19 increases or decreases the resistance value of the first resistor R1 by a correction amount indicated by a predetermined parameter CNTR1 (described later). Further, when correcting the resistance value of the first resistor R1, the correction circuit 19 also increases or decreases the resistance value of the correction target resistor Rt by a correction amount indicated by a parameter CNTRt (described later).

Information indicative of the parameter CNTR1 and of the parameter CNTRt is stored in advance in the register 20.

As described earlier, the parameter CNTR1 indicates the correction amount for the first resistor R1 in one execution of the correction cycle. The parameter CNTRt indicates the correction amount for the correction target resistor Rt in one execution of the correction cycle.

The parameter CNTR1 is determined in consideration, for instance, of the accuracy of correction. In other words, if the correction amount for the first resistor R1 in each execution of the correction cycle is small, the correction can be made with high accuracy. If, on the contrary, the correction amount for the first resistor R1 in each execution of the correction cycle is large, the correction can be completed within a short period of time.

On the other hand, the parameter CNTRt is determined so that the correction amount X1 for the first resistor R1 and the correction amount Xt for the correction target resistor Rt satisfy equation (3) below:

$$X1:Xt=1:\Delta R1/(\Delta R1-\Delta R2) \quad (3)$$

As shown in FIG. 3A, the ratio between ΔR1 and ΔR2 is constant. Therefore, ΔR1/(ΔR1−ΔR2) is a constant value irrespective of the stress. Hence, the parameter CNTRt can be determined in accordance, for instance, with the results of measurement and simulation after the determination of the parameter CNTR1. The parameter CNTR1 and the parameter CNTRt are stored, for instance, in a ROM or in a fuse, and are written into the register 20 when the semiconductor device 1 starts up.

Next, the method of operation of the resistance correction circuit 15 according to the present embodiment will be described. As shown in FIG. 3A, in the process of trimming, the resistance value of the correction target resistor rt is adjusted to attain the target value rt. Further, the resistance value of the first resistor R1 is adjusted until it equals the resistance value of the second resistor R2. In other words, the resistance value of the first resistor R1 and the resistance value of the second resistor R2 are equal to r0.

If, after the process of trimming, the stress applied to the semiconductor chip 7 changes, the correction circuit 19 repeats the correction cycle. As a result, the resistance value of the first resistor R1 equals the resistance value of the second resistor R2. In this instance, the correction amount X1 for the first resistor R1 represents the difference between the resistance value of the first resistor R1 and the resistance value of the second resistor R2. Further, the correction circuit 19 corrects the resistance value of the correction target resistor Rt by the correction amount Xt. From equation (3) presented earlier, the correction amount Xt for the correction target resistor Rt can be expressed by equation (4) below:

$$Xt=X1 \times \Delta R1/(\Delta R1-\Delta R2) \quad (4)$$

When the correction amount Xt for the correction target resistor Rt is determined in accordance with equation (4) above, the resistance value of the correction target resistor Rt is corrected to attain the target value rt. This correction process is described below.

Figure 3B:
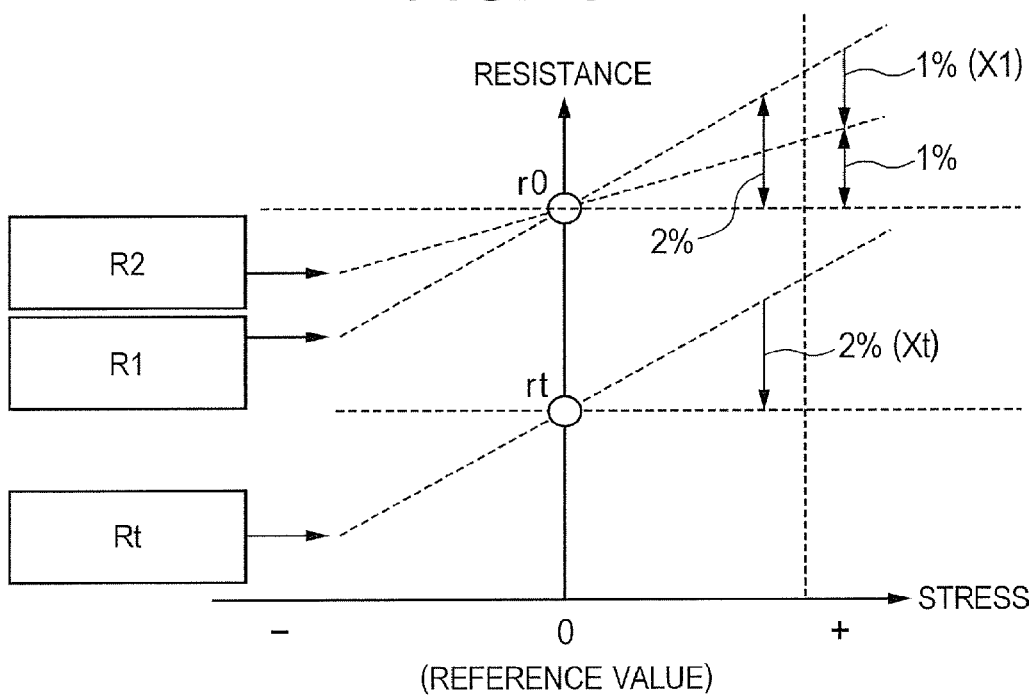
FIG. 3B is a diagram illustrating the relationship between stress and the resistance value of each resistor.

It is assumed, as an example, that the resistance value of the first resistor R1 is varied by 2% from r0 while the resistance value of the second resistor R2 is varied by 1% from r0 as shown in FIG. 3B. In this instance, the resistance value of the correction target resistor Rt should be varied by 2% from the target value rt, as is the case with the first resistor R1. When the resistance value of the first resistor R1 varies, the correction circuit 19 corrects the resistance value of the first resistor R1 so that it agrees with the resistance value of the second resistor R2. The correction amount X1 for the first resistor R1 is 1%, which is calculated from the equation 2%−1%. Meanwhile, the correction amount Xt for the correction target resistor Rt is 1%×ΔR1/(ΔR1−ΔR2), which is derived from equation (4) above. Here, ΔR1/(ΔR1−ΔR2) is a constant value irrespective of the stress, as shown in FIG. 3A. In other words, the equation ΔR1/(ΔR1−ΔR2) is equivalent to the equation 2%/(2%−1%)=2. Thus, the correction amount Xt is 2%. It means that the resistance value of the correction target resistor Rt is corrected by 2%. Hence, as shown in FIG. 3B, the resistance value of the correction target resistor Rt is corrected to attain the target value rt. Consequently, the variation in the resistance value, which is caused by stress changes, is compensated for.

The above compensation process is described in further detail below.

It is assumed that the resistance value variability of the correction target resistor Rt due to the stress σ is ΔRt. It is also assumed that the resistance value variability of the first resistor R1 due to the stress is ΔR1. It is further assumed that the resistance value variability of the second resistor R2 due to the stress is ΔR2. It is furthermore assumed that the resistance values of the first and second resistors Rt, R2 are r0 when the magnitude of the stress is equal to the reference value. Moreover, it is assumed that the resistance value of the correction target resistor Rt is rt when the magnitude of the stress is equal to the reference value. In this instance, the corrected resistance value R1 of the first resistor R1, the corrected resistance value R2 of the second resistor R2, and the corrected resistance value Rt of the correction target resistor Rt are respectively expressed by equations (5) to (7) below:

$$R2=(1+\Delta R2 \times \sigma) \times r0 \quad (5)$$

$$R1=(1+\Delta R1 \times \sigma) \times r0 \times (1+X1) \quad (6)$$

$$Rt=(1+\Delta R1 \times \sigma) \times rt \times (1+Xt) \quad (7)$$

As the correction circuit 19 operates so that R1=R2, equations (8) to (10) below are derived from equations (5) and (6) above:

$$(1+\Delta 2 \times \sigma) \times r0=(1+\Delta R1 \times \sigma) \times r0 \times (1+X1) \quad (8)$$

$$1+X1=(1+\Delta R2 \times \sigma)/(1+\Delta R1 \times \sigma) \quad (9)$$

$$X1=\{1+\Delta R2 \times \sigma)-(1+\Delta R1 \times \sigma)\}/(1+\Delta R1 \times \sigma)=(\Delta R2-\Delta R1) \times \sigma/(1+\Delta R1 \times \sigma) \quad (10)$$

Equation (10) above determines the correction amount X1 for the first resistor R1. Subsequently, as the first resistor R1 is equal to the correction target resistor Rt in the resistance value variability due to the stress (ΔR1=ΔRt), the resistance value Rt of the correction target resistor Rt is expressed by equation (11) below, which is derived from equations (3), (7), and (10) above:

$$Rt=(1+\Delta R1 \times \sigma) \times rt \times \{1+\Delta R1/(\Delta R1-\Delta R2) \times X1\}=(1+\Delta R1 \times \sigma) \times rt \times \{1+\Delta R1/(\Delta R1-\Delta R2) \times (\Delta R2-\Delta R1) \times \sigma/(1+\Delta R1+\sigma)=rt \times (1+\Delta R1 \times \sigma) \times \{1-\Delta R1 \times \sigma/(1+\Delta R1 \times \sigma)\}=rt \times (1+\Delta R1 \times \sigma) \times (1+\Delta R1 \times \sigma-\Delta R1 \times \sigma)/(1+\Delta R1 \times \sigma)=rt \quad (11)$$

From equation (11) above, it is understood that the resistance value of the correction target resistor Rt is equal to the target value rt and not affected by the stress σ.

As described above, the present embodiment includes the first resistor R1 and the second resistor R2, which differ in the relationship between the stress and the resistance value. The ratio between the variability ΔR1 of the first resistor R1 and the variability ΔR2 of the second resistor R2 (ΔR1:ΔR2) is constant irrespective of the stress. Therefore, ΔR1/(ΔR1−ΔR2) is also constant irrespective of the stress. Using this relationship, the correction section 40 detects the resistance value difference between the first resistor R1 and the second resistor R2 and corrects the resistance value of the correction target resistor Rt in accordance with the result of detection to attain the target value rt. This makes it possible to suppress the stress-induced variation in the resistance value of the correction target resistor Rt.

The present embodiment has been described on the assumption that the resistance value of each resistor is in proportion to the stress as shown in FIGS. 3A and 3B. In some cases, however, the resistance value of a resistor may be in inverse proportion to the stress. For example, the document named "Operating Principles and Glossary of Fujikura Semiconductor Pressure Sensors," Oct. 31, 2012 (http://www-.fujikura.co.jp/products/electronic/sensor/data/technical_note.pdf#search='Fujikura%20semiconductor pressure sensor9') states that the relationship expressed by equation (12) below is established between the stress σ and the resistance value R when the resistor is formed of polycrystalline silicon:

$$\sigma = EsDs^2/6Df(1-Vs)R \qquad (12)$$

where Es is the Young's modulus, Ef is the Young's modulus of polycrystalline silicon thin film, Df is the thickness of the polycrystalline silicon thin film, Ds is the thickness of a silicon substrate, and Vs is the Poisson's ratio of the silicon substrate.

Figure 4:
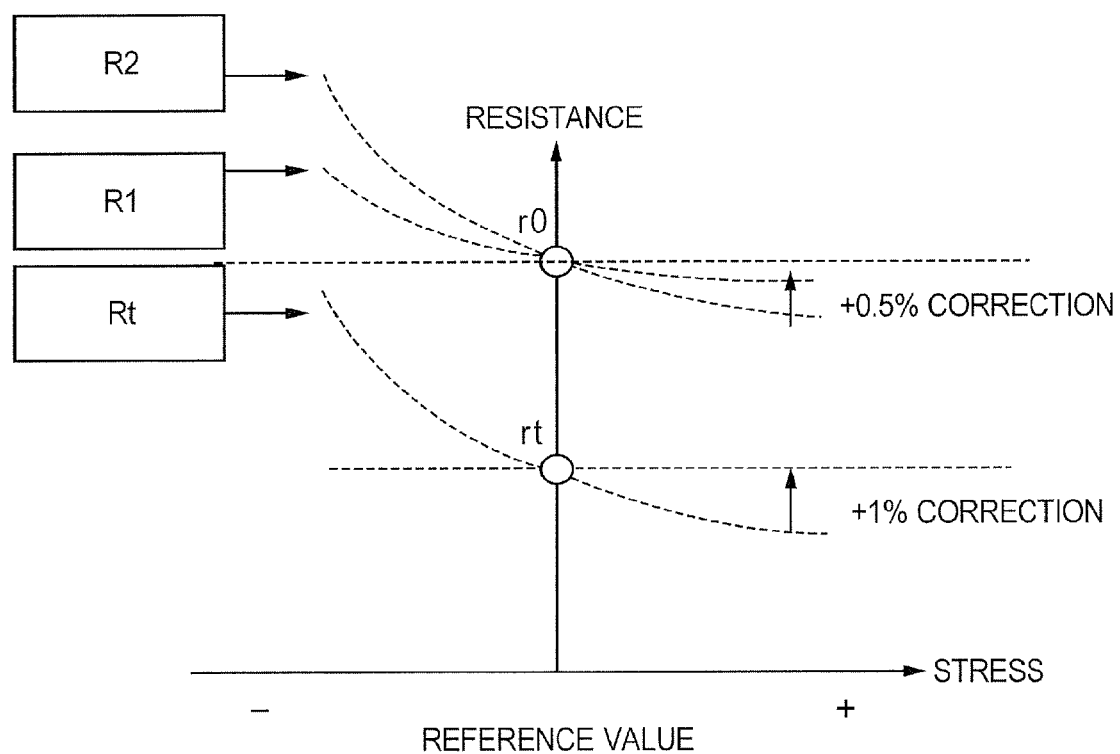
FIG. 4 is a conceptual diagram illustrating an operation performed when the variability of the resistance value is in inverse proportion to stress.

Even when the variability of the resistance value is in inverse proportion to the stress, the ratio between the resistance value variability of the first resistor R1 and the resistance value variability of the second resistor R2 is constant irrespective of the stress. Therefore, the present embodiment can be applied. FIG. 4 is a conceptual diagram illustrating an operation performed when the variability of the resistance value is in inverse proportion to the stress. Let us assume that the resistance value of the correction target resistor Rt is varied by 1% from the target value rt due to the stress as shown in FIG. 4. In this instance, the resistance value of the first resistor R1 is also varied by 1% from the resistance value r0 in the reference state. Meanwhile, let us assume that the resistance value of the second resistor R2 is varied by 0.5% from the resistance value rt in the reference state. In this instance, the resistance value of the first resistor R1 is corrected by 0.5% (=1%−0.5%) so that it agrees with the resistance value of the second resistor R2. At the same time, the resistance value of the correction target resistor Rt is also corrected by 1% in accordance with previously described equation (4). As a result, the resistance value of the correction target resistor Rt is corrected to attain the target value rt.

Further, the present embodiment has been described on the assumption that the correction section 40 includes the comparator circuit 18 and changes the resistance value of the first resistor R1 in accordance with the result of comparison by the comparator circuit 18 until it agrees with the resistance value of the second resistor R2. However, if the resistance value difference between the first resistor R1 and the second resistor R2 can be detected, the comparator circuit 18 need not always be used. For example, the correction section 40 may use an analog-to-digital converter or the like to detect the potential difference between the node a and the node b, thereby determining the resistance value difference between the first resistor R1 and the second resistor R2. The correction circuit 19 may then determine the correction amount Xt for the resistance value of the correction target resistor Rt in accordance with the result of detection by the analog-to-digital converter or the like so that the resistance value of the correction target resistor Rt agrees with the target value rt.

The arrangement of the resistors will now be described. In the present embodiment, it is important that the first resistor R1, the second resistor R2, and the correction target resistor Rt be subjected to stresses of the same magnitude. Further, it is preferred that the first to fourth resistors R1-R4 and the correction target resistor Rt be subjected to stresses of the same magnitude. However, if these resistors are disposed at separate locations, they are likely to be subjected to stresses of different magnitudes. As such being the case, the first resistor R1, the second resistor R2, and the correction target resistor Rt are preferably disposed in common-centroid layout. In other words, the first resistor R1, the second resistor R2, and the correction target resistor Rt are disposed in such a manner that they have the same center of gravity. Moreover, the first to fourth resistors R1-R4 and the correction target resistor Rt are more preferably disposed in common-centroid layout.

Figure 5:
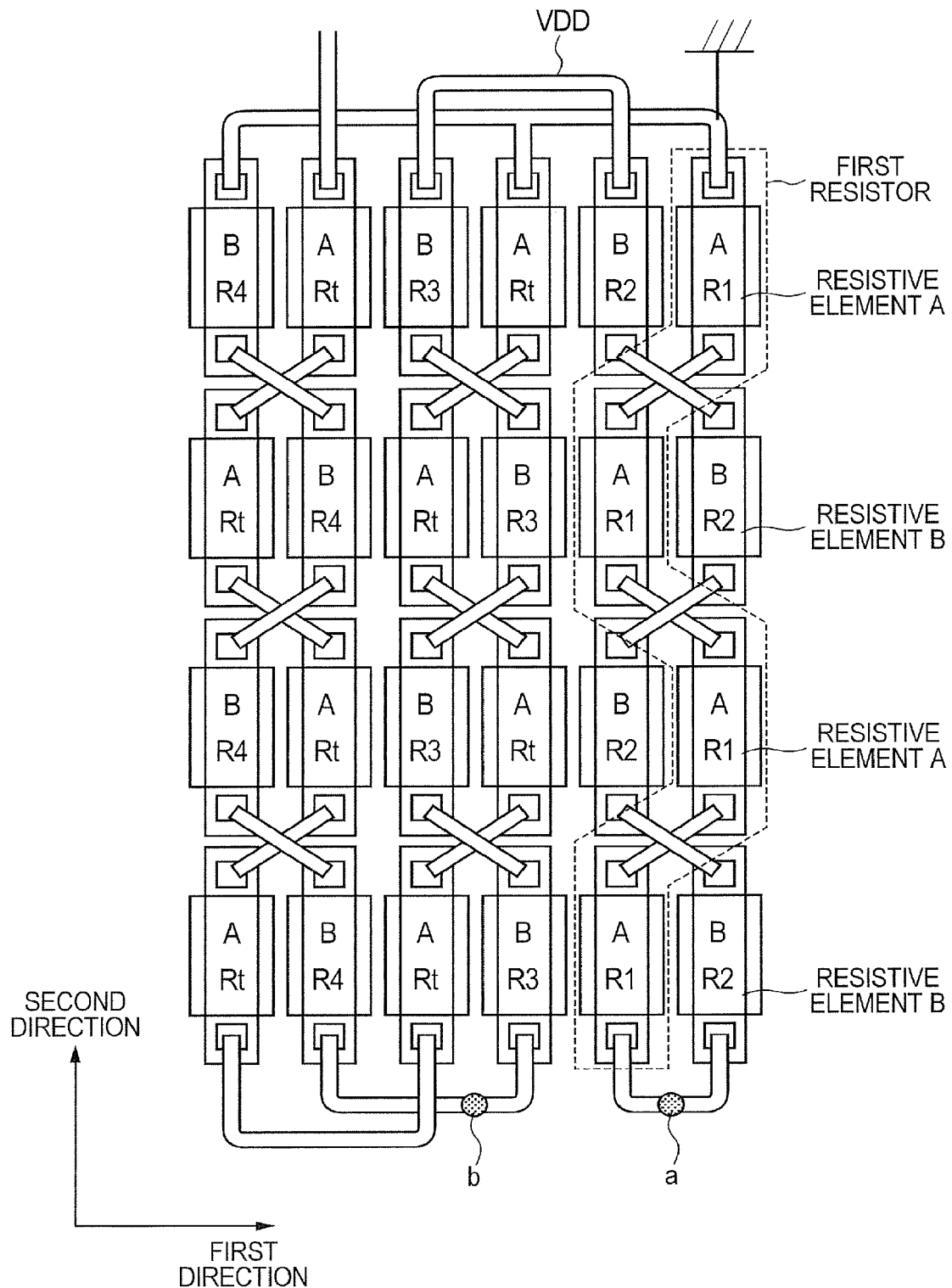
FIG. 5 is a diagram illustrating an exemplary arrangement of first to fourth resistors and a correction target resistor.

FIG. 5 is a diagram illustrating an exemplary arrangement of the first to fourth resistors R1-R4 and the correction target resistor Rt. As shown in FIG. 5, a first direction and a second direction are defined. The first direction and the second direction are orthogonal to each other. In the example shown in FIG. 5, each resistor includes a plurality of series-coupled resistive elements. The first resistor R1 and the correction target resistor Rt each include a plurality of resistive elements A. On the other hand, the second to fourth resistors R2-R4 each include a plurality of resistive elements B. Resistive elements A have the same structure. Resistive elements B also have the same structure. However, the structure of each of resistive elements A differs from the structure of each of resistive elements B. Resistive elements A and resistive elements B are disposed to alternate with each other not only in the first direction but also in the second direction. In each resistor, the resistive elements are coupled to each other with wires. The wires shown in FIG. 5 do not indicate a detailed arrangement, but indicate the coupling relationship between the resistive elements.

When the layout shown in FIG. 5 is adopted, the first to fourth resistors R1-R4 and the correction target resistor Rt can be disposed in such a manner that they have the same center of gravity. Hence, the first to fourth resistors R1-R4 and the correction target resistor Rt can be easily disposed so that they are subjected to stresses of the same magnitude. This makes it possible to correct the resistance value of the correction target resistor Rt with increased accuracy.

Figure 6:
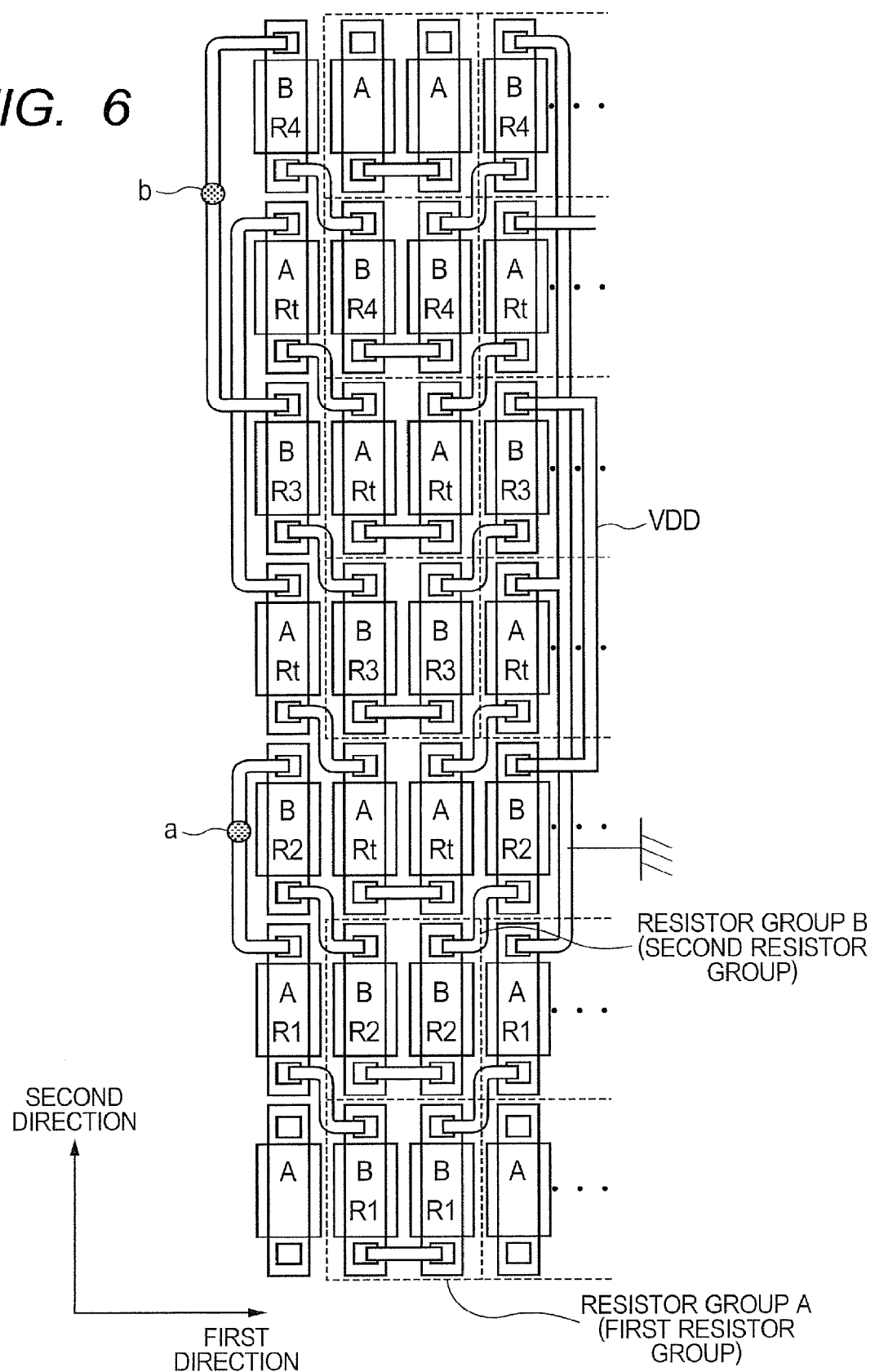
FIG. 6 is a diagram illustrating another exemplary arrangement of the resistors.

Meanwhile, FIG. 6 is a diagram illustrating another exemplary arrangement of the resistors. In the example shown in FIG. 6, a first direction and a second direction are also defined. The first direction and the second direction are orthogonal to each other. The first resistor R1 and the correction target resistor Rt each include a plurality of series-coupled resistor groups A (first resistor groups). Resistor groups A each include two resistive elements A, which are aligned in the first direction. Two resistive elements A included in each of resistor groups A are electrically coupled to each other with wires. Meanwhile, the second to fourth resistors R2-R4 each include a plurality of series-coupled resistor groups B (second resistor groups). As is the case with resistor groups A, resistor groups B each include two resistive elements B, which are aligned in the first direction. Two resistive elements A are electrically coupled to each other with wires. Resistor groups A and resistor groups B are disposed to alternate with each other not only in the first direction but also in the second direction.

Adopting the layout shown in FIG. 6 makes it possible to reduce the number of crossing wires. More specifically, in the example shown in FIG. 5, the wires coupling two resistive elements to each other cross the wires coupling the other two resistive elements to each other. Therefore, it is necessary to prepare at least two wire layers and dispose wires in the greater part of each wire layer. When, on the other hand, the layout shown in FIG. 6 is adopted, the wires coupling two resistive elements to each other do not always cross the wires coupling the other two resistive elements to each other. As the number of crossing wires can be reduced, most of the wires can be disposed in one wire layer to improve the efficiency of layout and reduce the occurrence of an error in the resistance value due to wiring resistance.

Figure 7:
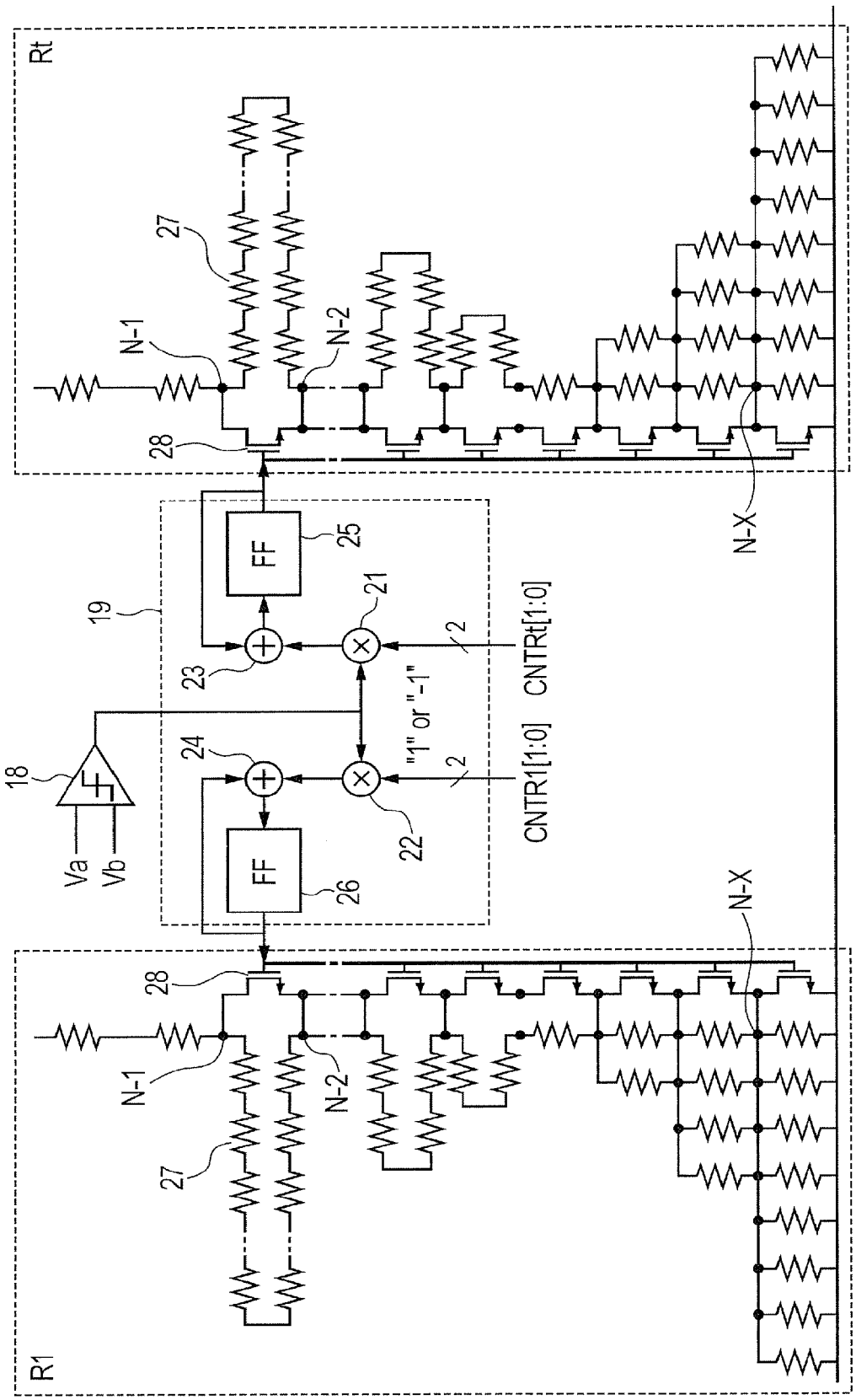
FIG. 7 is an exemplary circuit diagram illustrating a correction circuit, the correction target resistor, and the first resistor.

The configurations of the correction circuit 19, of the correction target resistor Rt, and of the first resistor R1 will now be described in detail. FIG. 7 is an exemplary circuit diagram illustrating the correction circuit 19, the correction target resistor Rt, and the first resistor R1.

First of all, the configuration of the correction target resistor Rt will be described. As shown in FIG. 7, the correction target resistor Rt includes a plurality of transistors 28, a plurality of nodes N (N-1 to N-x), and a plurality of resistive elements 27. Two neighboring nodes N are coupled in series or in parallel by using one or more resistive elements 27. Each of the transistors 28 is disposed so as to switch the electrical coupling between the two neighboring nodes N. Selectively turning on or turning off each transistor 28 in the above configuration changes the resistance value between one end (node N-1) and the other end (node N-x) of the set of nodes.

The first resistor R1 has the same configuration as the correction target resistor Rt. In other words, the first resistor R1 also includes a plurality of transistors 28, a plurality of nodes (N-1 to N-x), and a plurality of resistive elements 27. Selectively turning on or turning off each transistor 28 changes the resistance value between one end (node N-1) and the other end (node N-x) of the set of nodes. It means that the resistance value of the first resistor R1 changes.

Next, the configuration of the correction circuit 19 will be described. The correction circuit 19 includes a multiplier 22, a multiplier 21, an adder-subtractor 23, an adder-subtractor 24, a flip-flop circuit 25, and a flip-flop circuit 26.

The multiplier 21 acquires a control signal CNTRt indicative of the parameter CNTRt from the register. The multiplier 21 also acquires a signal indicative of the result of comparison between the potential Va and the potential Vb from the comparator circuit 18. The multiplier 21 multiplies the parameter CNTRt by +1 when Va>Vb and multiples the parameter CNTRr by −1 when Va<Vb. The result of multiplication is supplied to the adder-subtractor 23 as a multiplication result signal. The adder-subtractor 23 acquires the multiplication result signal and a retention signal indicative of a value retained by the flip-flop circuit 25, and adds the multiplication result to or subtracts the multiplication result from the value retained by the flip-flop circuit 25. The result of addition or subtraction is supplied to the flip-flop circuit 25. The flip-flop circuit 25 retains a value indicative of the result of addition/subtraction by the adder-subtractor 23. The flip-flop circuit 25 is coupled to the gates of the transistors 28 included in the correction target resistor Rt so that the resistance value of the correction target resistor Rt is equal to a value corresponding to the retained value.

The configurations of the multiplier 22, adder-subtractor 24, and flip-flop circuit 26 are the same as those of the multiplier 21, adder-subtractor 23, and flip-flop circuit 25. In other words, the multiplier 22 acquires a control signal CNTR1 indicative of the parameter CNTR1 from the register. The multiplier 22 also acquires a signal indicative of the result of comparison between the potential Va and the potential Vb from the comparator circuit 18. The multiplier 22 multiplies the parameter CNTR1 by +1 when Va>Vb and multiples the parameter CNTR1 by −1 when Va<Vb. The result of multiplication is supplied to the adder-subtractor 24 as a multiplication result signal. The adder-subtractor 24 acquires the multiplication result signal and a retention signal indicative of a value retained by the flip-flop circuit 26, and adds the multiplication result to or subtracts the multiplication result from the value retained by the flip-flop circuit 26. The result of addition or subtraction is supplied to the flip-flop circuit 26. The flip-flop circuit 25 retains a value indicative of the result of addition/subtraction by the adder-subtractor 24. The flip-flop circuit 26 is coupled to the gates of the transistors 28 included in the first resistor R1 so that the resistance value of the first resistor R1 is equal to a value corresponding to the value retained by the flip-flop circuit 26.

The above configuration ensures that when Va<Vb, the resistance value of the first resistor R1 increases by a value corresponding to the parameter CNTR1 in each execution of the correction cycle. Further, the resistance value of the correction target resistor Rt increases by a value corresponding to the parameter CNTRt. When, on the other hand, Va>Vb, the resistance value of the first resistor R1 decreases by a value corresponding to the parameter CNTR1. Further, the resistance value of the correction target resistor Rt decreases by a value corresponding to the parameter CNTRt. Hence, a correction operation is repeated until Va=Vb.

Second Embodiment

Figure 8:
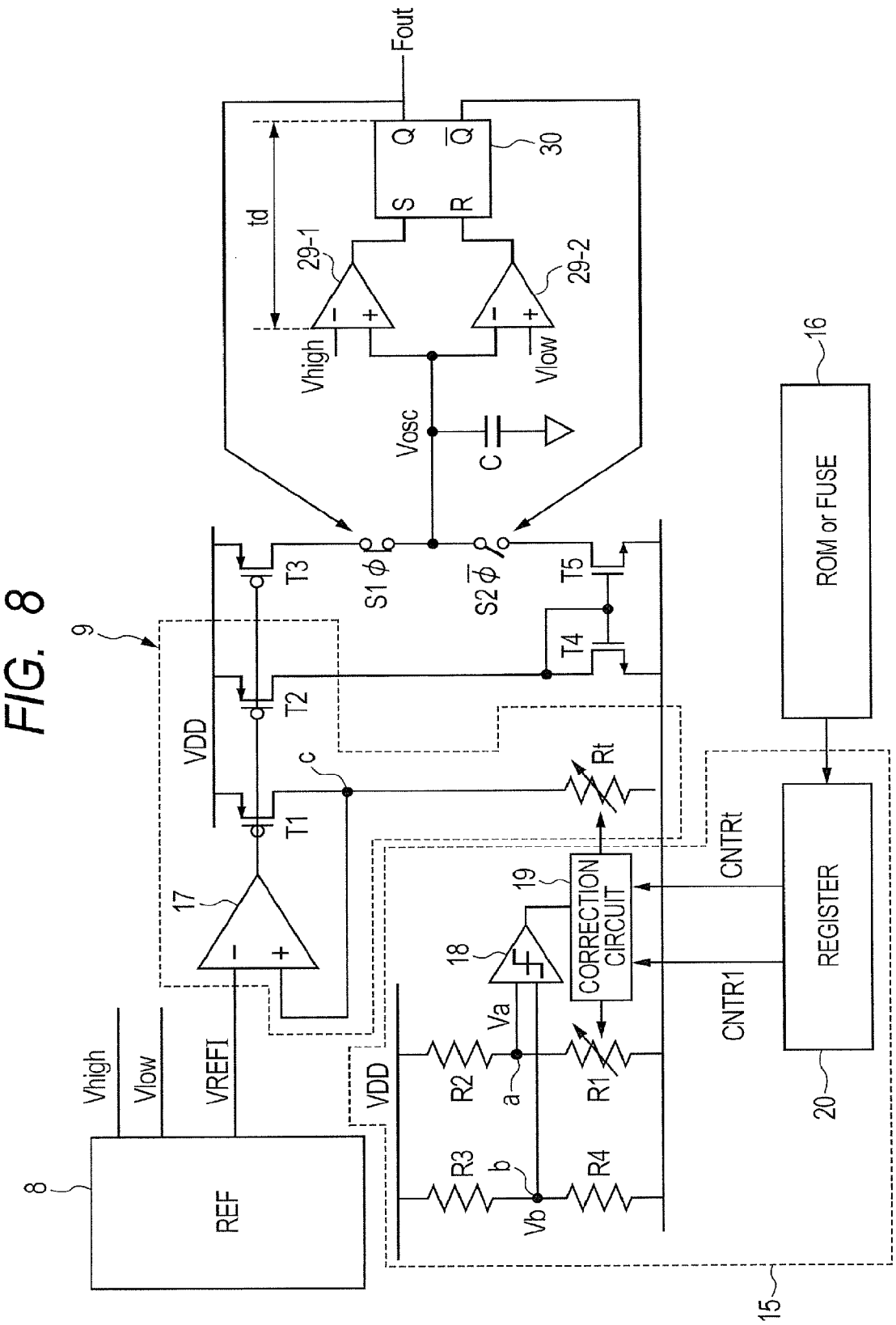
FIG. 8 is a circuit diagram illustrating the OCO according to a second embodiment.

A second embodiment will now be described. FIG. 8 is a circuit diagram illustrating the OCO 5 according to the second embodiment. The second embodiment will be described on the assumption that the resistance correction circuit 15 is applied to the OCO 5 of a relaxation type.

As is obvious from FIG. 8, the present embodiment does not include the frequency-to-voltage converter circuit 10, the integration circuit 31, the control circuit 14, and the voltage-controlled oscillator circuit 13, which are included in the first embodiment (see FIG. 2), but instead includes transistors T3, T4, T5, switch circuits S1, S2, a capacitor C, comparators 29-1, 19-2, and an RS flip-flop circuit 30. Further, the reference voltage generator circuit 8 generates a reference voltage Vhigh and a reference voltage Vlow instead of the reference voltage VREFC. In the other respects, the present embodiment may have the same configuration as the first embodiment. Therefore, the configuration of the present embodiment will not be described in detail.

The transistor T3 is disposed between the first power supply VDD and the switch circuit S1. The switch circuit S1 is disposed between the transistor T3 and a node D. The switch circuit S2 is disposed between the node D and the transistor T5. The transistor T5 is disposed between the switch circuit S2 and the second power supply GND. The transistor T4 is disposed between the transistor T2 and the second power supply GND. The gate of the transistor T4 is coupled to the gate of the transistor T5 and to the drain of the transistor T4. The capacitor C is coupled at one end to the node D and grounded at the other end. The comparator 29-1 is coupled at its negative (−) input end to the reference voltage generator circuit 8 so that the reference voltage Vhigh is supplied. The positive (+) input end of the comparator 29-1 is coupled to the node D. The output end of the comparator 29-1 is coupled to a set input end (S) of the RS flip-flop circuit 30. The comparator 29-2 is coupled at its positive (+) input end to the reference voltage generator circuit 8 so that the reference voltage Vlow is supplied. The negative (−) input end of the comparator 29-2 is coupled to the node D. The output end of the comparator 29-2 is coupled to a reset input end (R) of the RS flip-flop circuit 30. An output (Q) of the RS flip-flop circuit outputs the output signal Fout. The output signal Fout is used to selectively turn on or turn off the switch circuit S1. An inverted-output end of the RS flip-flop circuit is coupled to the switch circuit S2 so that a signal output from the inverted-output end of the RS flip-flop circuit is used to selectively turn on or turn off the switch circuit S2.

Figure 9:
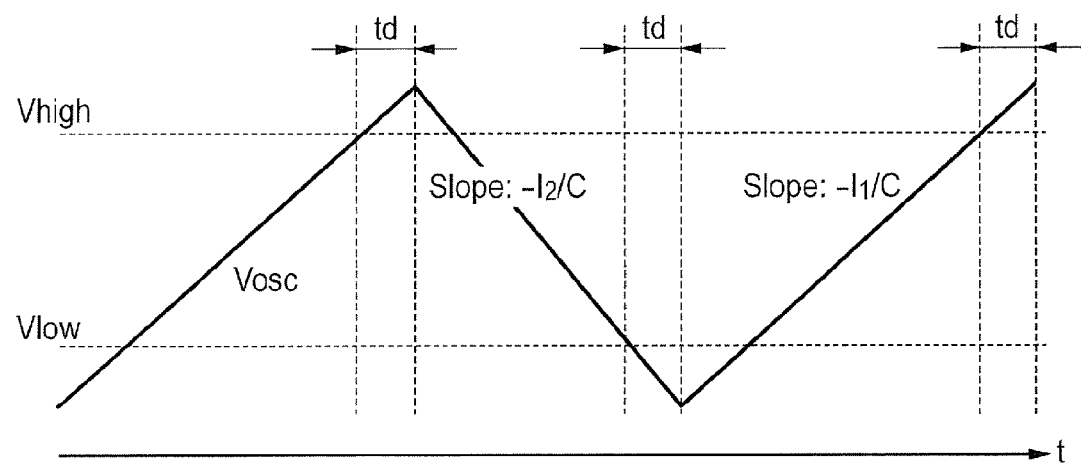
FIG. 9 is a timing diagram illustrating the method of operation of the OCO according to the second embodiment.

FIG. 9 is a timing diagram illustrating the method of operation of the OCO 5 according to the present embodiment. In FIG. 9, the horizontal axis represents time and the vertical axis represents voltage. FIG. 9 shows the reference voltage Vhigh, the reference voltage Vlow, and the waveform of a voltage Vosc at the node D. In the present embodiment, the switch circuit S2 is off when the switch circuit S1 is on. In this instance, a charge mode prevails so that the capacitor C is charged by a reference current I1 that flows from the first power supply VDD through the switch circuit S1. When the voltage Vosc exceeds the reference voltage Vhigh, the comparator 29-1 sets the RS flip-flop circuit 30 to perform a discharge. In reality, the output Q of the RS flip-flop circuit 30 switches when a delay time td elapses from the instant at which the voltage Vosc exceeds the reference voltage Vhigh. At the time of the discharge, the capacitor C is discharged by a reference current I2. The RS flip-flop circuit 30 is reset when the delay time td elapses from the instant at which the voltage Vosc drops below the reference voltage Vlow. As a result, the charge is performed again.

The oscillation period T of the output signal Fout is expressed by equation (13) below when charge time is t1, discharge time is t2, and delay time is td. The charge time t1, the charge time t2, and the reference current I1 are respectively expressed by equations (14), (15), and (16) below:

$$T = t1 + t2 + 2 \times td \quad (13)$$

$$t1 = C/I1 \times (Vhigh - Vlow) \quad (14)$$

$$t2 = C/I2 \times (Vhigh - Vlow) \quad (15)$$

$$I1 = VrefI/R \quad (16)$$

The reference current I1 and the reference current I2 are equal because they are used to form a current mirror. Thus, the oscillation frequency F is expressed by equation (17) below:

$$F = 1/T = 1/(2RtC \times (Vhigh - Vlow)/VrefI + 2 \times td) \quad (17)$$

Equation (17) above indicates that the oscillation frequency F is also dependent on the resistance value of the correction target resistor Rt in the present embodiment. Therefore, the stress-induced variation in the oscillation frequency can be suppressed by correcting the resistance value of the correction target resistor Rt.

Even when the relaxation OCO 5 includes the correction target resistor Rt, the resistance correction circuit 15 according to the present embodiment, which has been described above, can suppress the variation in the resistance value that is caused by stress changes.

The present embodiment has been described on the assumption that the relaxation OCO 5 includes the correction target resistor Rt. However, the correction target resistor Rt need not always be included in the OCO 5. For example, the semiconductor chip 7 may be provided with a temperature sensor. In some cases, the temperature sensor may include a variable resistor. When the resistance value of such a variable resistor varies due to stress, it may be difficult to make accurate temperature measurements. Therefore, the resistance value of the variable resistor included in the temperature sensor can be corrected by using the resistance correction circuit 15.

While the present invention contemplated by its inventors has been described in detail in terms of preferred embodiments, it is to be understood that the present invention is not limited to those preferred embodiments, but extends to various modifications that nevertheless fall within the spirit and scope of the appended claims.

What is claimed is:

1. A semiconductor device comprising:
an oscillator circuit generating a clock signal; and
circuit blocks operating based on the clock signal,
wherein the oscillator circuit comprises a resistance correction circuit including:
a first resistor whose stress-resistance value relationship is a first relationship;
a second resistor whose stress-resistance value relationship is a second relationship;
a correction target resistor; and
a correction section that controls the resistance value of the correction target resistor,
wherein the correction section detects the difference between the resistance value of the first resistor and the resistance value of the second resistor and corrects, in accordance with the result of detection, the resistance value of the correction target resistor, and
wherein the clock signal has a frequency corresponding to the resistance value of the correction target resistor.

2. The semiconductor device according to claim 1, wherein the circuit blocks includes a CPU and a RAM.

3. The semiconductor device according to claim 2, wherein the first relationship and the second relationship differ from each other, and the stress-resistance value relationship of the correction target resistor is equal to the first relationship.

4. The semiconductor device according to claim 2,
wherein the correction target resistor is set so that the resistance value thereof is equal to a target value when the correction target resistor is subjected to a reference stress, and
wherein the first resistor is set so that the resistance value thereof is equal to the resistance value of the second resistor when the first resistor is subjected to the reference stress.

5. The semiconductor device according to claim 2,
wherein the correction section includes:
a comparator circuit that compares the resistance value of the first resistor with the resistance value of the second resistor; and
a correction circuit that corrects, in accordance with the result of comparison by the comparator circuit, the resistance value of the first resistor until the resistance value thereof agrees with the resistance value of the second resistor, and
wherein the correction circuit corrects the resistance value of the correction target resistor by an amount corresponding to a correction amount X1 for the resistance value of the first resistor.

6. The semiconductor device according to claim 5, further comprising:
a third resistor whose stress-resistance value relationship is the second relationship; and
a fourth resistor whose stress-resistance value relationship is the second relationship,
wherein the first resistor is coupled at one end to a first power supply and at the other end to a first node,
wherein the second resistor is coupled at one end to the first node and at the other end to a second power supply,
wherein the third resistor is coupled at one end to the first power supply and at the other end to a second node,
wherein the fourth resistor is coupled at one end to the second node and at the other end to the second power supply,
wherein the comparator circuit compares the resistance value of the first resistor with the resistance value of the second resistor by comparing the potential of the first node with the potential of the second node, and
wherein the correction circuit corrects the resistance value of the first resistor until the resistance value thereof agrees with the resistance value of the second resistor by changing the resistance value of the first resistor until the first node and the second node have the same potential.

7. The semiconductor device according to claim 2, wherein the first resistor and the second resistor are positioned so as to be subjected to the same stress as the correction target resistor.

8. The semiconductor device according to claim 7,
wherein the correction target resistor includes a plurality of series-coupled resistive elements,
wherein the first resistor includes a plurality of series-coupled resistive elements,
wherein the second resistor includes a plurality of series-coupled resistive elements,
wherein each of the resistive elements included in the correction target resistor is a resistive element of a first type,
wherein each of the resistive elements included in the first resistor is a resistive element of the first type,
wherein each of the resistive elements included in the second resistor is a resistive element of a second type, and
wherein the first resistive elements and the second resistive elements are disposed in common-centroid layout.

9. The semiconductor device according to claim 8, wherein the first resistive elements and the second resistive elements are disposed so as to alternate with each other not only in a first direction but also in a second direction, the second direction being orthogonal to the first direction.

10. The semiconductor device according to claim 8,
wherein the first resistive elements include a plurality of first resistor groups,
wherein the second resistive elements include a plurality of second resistor groups,
wherein the first resistor groups include two of the resistive elements of the first type aligned in a first direction,
wherein the second resistor groups include two of the resistive elements of the second type aligned in the first direction, and
wherein the first resistor groups and the second resistor groups are disposed so as to alternate with each other not only in the first direction but also in a second direction.

* * * * *